US009651625B2

(12) United States Patent
Kikuchi et al.

(10) Patent No.: US 9,651,625 B2
(45) Date of Patent: May 16, 2017

(54) BATTERY MONITORING APPARATUS AND BATTERY MONITORING SYSTEM

(75) Inventors: Mutsumi Kikuchi, Hitachinaka (JP); Akihiko Kudo, Hitachinaka (JP); Tomonori Kanai, Hitachinaka (JP); Hikaru Miura, Hitachinaka (JP); Akihiko Emori, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 419 days.

(21) Appl. No.: 14/350,288

(22) PCT Filed: Oct. 7, 2011

(86) PCT No.: PCT/JP2011/073253
§ 371 (c)(1),
(2), (4) Date: Jul. 9, 2014

(87) PCT Pub. No.: WO2013/051156
PCT Pub. Date: Apr. 11, 2013

(65) Prior Publication Data
US 2014/0312913 A1    Oct. 23, 2014

(51) Int. Cl.
*G01R 31/36* (2006.01)
*H01M 10/48* (2006.01)
(Continued)

(52) U.S. Cl.
CPC .......... *G01R 31/3658* (2013.01); *B60L 3/04* (2013.01); *B60L 3/12* (2013.01); *B60L 11/1803* (2013.01);
(Continued)

(58) Field of Classification Search
CPC .................................................. G01R 31/3658
(Continued)

(56) References Cited

U.S. PATENT DOCUMENTS 7,760,106 B2 * 7/2010 Vandensande ....... G01R 31/362
320/118
2009/0130541 A1 * 5/2009 Emori .................. H02J 7/0019
429/61

(Continued)

FOREIGN PATENT DOCUMENTS

JP      06-138256 A      5/1994
JP      08-098419   *    4/1996
(Continued)

*Primary Examiner* — Samuel Berhanu
*Assistant Examiner* — Tessema Kebede
(74) *Attorney, Agent, or Firm* — Volpe and Koenig, P.C.

(57) ABSTRACT

A battery monitoring apparatus comprises a reception section to receive a radio signal and to output power and a demodulated signal according to the radio signal; a first power source circuit to perform power supply based on the power; a decode circuit to operate upon receiving the power supply from the first power source circuit and to output an activation signal and a command based on the demodulated signal; a second power source circuit to be activated according to the activation signal and to perform power supply; a battery monitoring circuit to operate upon receiving the power supply from the second power source circuit and to output a monitoring result of a state of the battery according to the command; and a transmission section to operate upon receiving the power supply from the second power source circuit and to wirelessly transmit the monitoring result.

8 Claims, 9 Drawing Sheets

(51) Int. Cl.
*H04Q 9/00* (2006.01)
*B60L 3/04* (2006.01)
*B60L 3/12* (2006.01)
*B60L 11/18* (2006.01)
*H01M 10/44* (2006.01)

(52) U.S. Cl.
CPC ....... *B60L 11/1861* (2013.01); *B60L 11/1866* (2013.01); *H01M 10/482* (2013.01); *H04Q 9/00* (2013.01); *B60L 2240/545* (2013.01); *B60L 2240/547* (2013.01); *B60L 2240/549* (2013.01); *B60L 2240/80* (2013.01); *B60L 2250/10* (2013.01); *B60L 2270/20* (2013.01); *G01R 31/3606* (2013.01); *G01R 31/3689* (2013.01); *H01M 10/441* (2013.01); *H04Q 2209/40* (2013.01); *H04Q 2209/82* (2013.01); *Y02T 10/7005* (2013.01); *Y02T 10/7044* (2013.01); *Y02T 10/7061* (2013.01); *Y02T 90/16* (2013.01)

(58) Field of Classification Search
USPC ........................................................ 324/426
See application file for complete search history.

(56) References Cited

U.S. PATENT DOCUMENTS

2010/0073003 A1* 3/2010 Sakurai ................... H02J 5/005
324/426
2010/0079146 A1* 4/2010 Kurose ................. B60L 3/0046
324/433

FOREIGN PATENT DOCUMENTS

| | | |
|---|---|---|
| JP | 08-098419 A | 4/1996 |
| JP | 2007-013749 A | 1/2007 |
| JP | 2008-211962 A | 9/2008 |
| JP | 2010-035417 A | 2/2010 |
| JP | 2010-081716 A | 4/2010 |
| JP | 2010-142083 A | 6/2010 |
| JP | 2013-085363 A | 5/2013 |
| WO | 2013/051157 A1 | 4/2013 |
| WO | 2013/051688 A1 | 4/2013 |

* cited by examiner

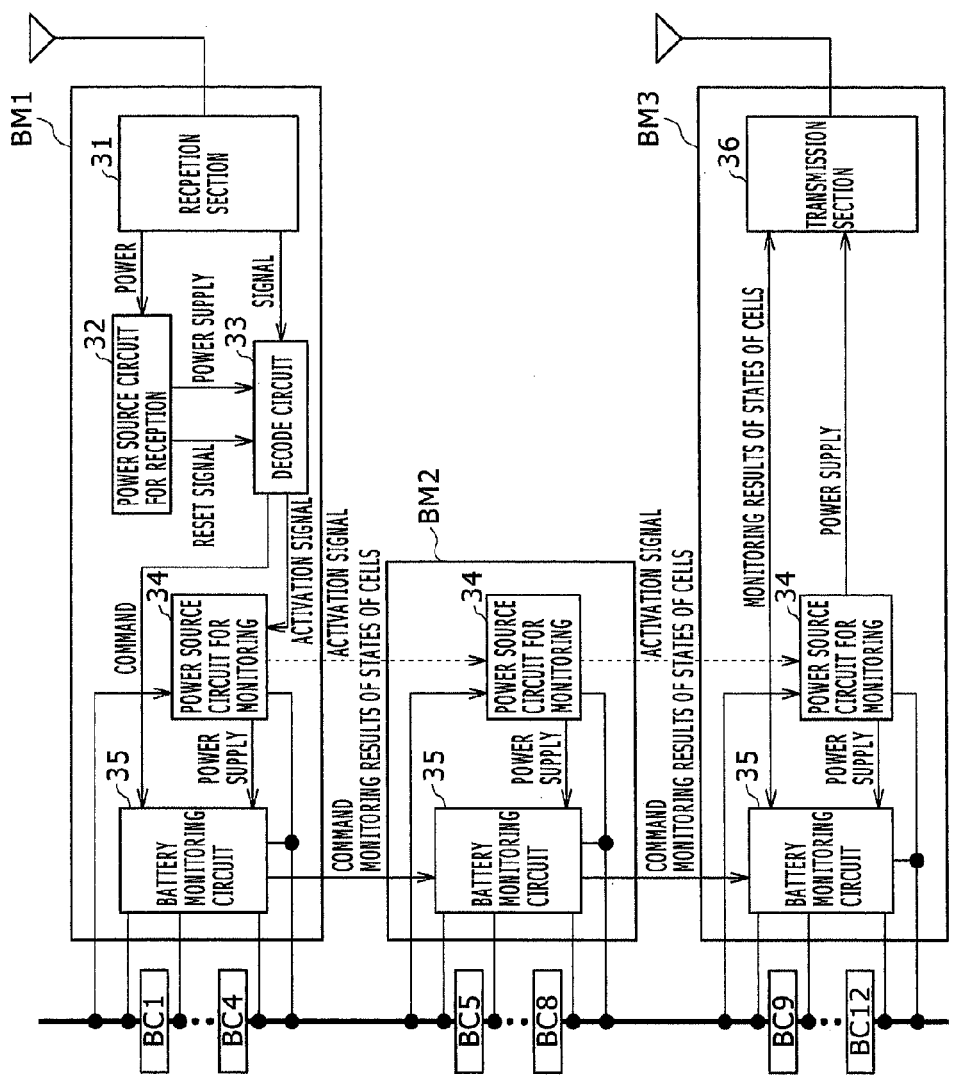

BATTERY MONITORING APPARATUS AND BATTERY MONITORING SYSTEM

TECHNICAL FIELD

The present invention relates to a battery monitoring apparatus and a battery monitoring system.

BACKGROUND ART

Conventionally, such a battery information management system is known as activating a battery information acquisition circuit and a radio circuit that are switched on through an activation circuit according to an instruction signal wirelessly transmitted from a management unit, and a piece of information on the battery acquired from the battery information acquisition circuit is wirelessly transmitted from the radio circuit to the management unit (refer to the disclosure of Patent Literature 1).

CITATION LIST

Patent Literature

Patent Literature 1: Japanese Unexamined Patent Application Publication No. 2010-81716

SUMMARY OF INVENTION

Technical Problem

However, as with the system disclosed in the above-mentioned Patent Literature 1, the activation circuit is switched on in error even when an unintended radio wave is received other than the instruction signal derived from the management unit, so that there is possibility that the battery information acquisition circuit and the radio circuit might be activated, with the result that there is apprehension in the aspect of power consumption and reliability that there arises fluctuation in the cell voltage through an unintended current consumption and as such.

Solution to Problem

The battery monitoring apparatus according to a first aspect of the present invention is intended for monitoring the state of a battery comprising one battery cell or plural battery cells connected in series, and the apparatus includes: a reception section to receive a radio signal transmitted from an upper controller and to output power according to the radio signal and a demodulated signal based on the radio signal; a first power source circuit to perform power supply based on the power output from the reception section; a decode circuit to operate upon receiving the power supply from the first power source circuit and to perform authentication based on the demodulated signal output from the reception section as well as to output an activation signal according to a result of the authentication and a command based on the demodulated signal; a second power source circuit to be activated according to the activation signal output from the decode circuit and to perform power supply based on power of the battery; a battery monitoring circuit to operate upon receiving the power supply from the second power source circuit and to output a monitoring result of a state of the battery according to the command output from the decode circuit; and a transmission section to operate upon receiving the power supply from the second power source circuit and to wirelessly transmit the monitoring result output from the battery monitoring circuit to the upper controller.

According to a second aspect of the present invention, as with the battery monitoring apparatus of the first aspect thereof, it is preferred that when the activation signal is not output again from the decode circuit to the second power source circuit by a time when a prescribed time-out duration has passed since the second power source circuit is activated, the second power source circuit halt power supply to the battery monitoring circuit and the transmission section.

According to a third aspect of the present invention, as with the battery monitoring apparatus of the second aspect thereof, it is preferred that the upper controller transmits the radio signal with a period shorter than the time-out duration.

According to a fourth aspect of the present invention, it is preferred that any of the battery monitoring apparatuses of the first to third aspects thereof include the second power source circuits and the battery monitoring circuits, in which the battery is arranged such that plural battery cell groups each comprising one of one battery cell and plural battery cells connected in series are connected in series, in which the second power source circuit and the battery monitoring circuit are separately provided for each of the battery cell groups, in which when the second power source circuit connected to an uppermost battery cell group among the battery cell groups receives the activation signal from the decode circuit, the second power source circuit performs power supply to the battery monitoring circuit connected to the uppermost battery cell group as well as outputs the activation signal to the second power source circuit connected to a lower battery cell group directly below the uppermost battery cell group, in which when the second power source circuit connected to an intermediate battery cell group among the battery cell groups receives the activation signal from the second power source circuit connected to the battery cell group one rank above the intermediate battery cell group, the second power source circuit connected to the intermediate battery cell group performs power supply to the battery monitoring circuit connected to the intermediate battery cell group as well as outputs the activation signal to the second power source circuit connected to the battery cell group one rank below the intermediate battery cell group, and in which when the second power source circuit connected to a lowermost battery cell group among the battery cell groups receives the activation signal from the second power source circuit connected to the battery cell group one rank above the lowermost battery cell group, the second power source circuit performs power supply to the battery monitoring circuit connected to the lowermost battery cell group and the transmission section.

According to the fifth aspect of the present invention, as with the battery monitoring apparatus of the fourth aspect thereof, it is preferred that when the battery monitoring circuit connected to the uppermost battery cell group receives the command from the decode circuit, the battery monitoring circuit connected to the uppermost battery cell group output the command and monitoring results of states of the battery cells comprising the uppermost battery cell group to the battery monitoring circuit connected to the battery cell group one rank below the uppermost battery cell group, in which when the battery monitoring circuit connected to the intermediate battery cell group receives the command from the battery monitoring circuit connected to the battery cell group one rank above the intermediate battery cell group, the battery monitoring circuit connected to the intermediate battery cell group outputs the command and the monitoring results of the states of the battery cells comprising the battery cell group one rank above the intermediate battery group as well as the monitoring results of the states of the battery cells comprising the intermediate battery cell group to the battery monitoring circuit connected to the battery cell group one rank below the intermediate battery cell group, and in which when the battery monitoring circuit connected to the lowermost battery cell group receives the command from the battery cell group one rank above the lowermost battery cell group, the battery monitoring circuit connected to the lowermost battery cell group outputs the monitoring results of the states of the battery cells comprising the battery cell group one rank above the lowermost battery cell group and the monitoring results of the states of the battery cells comprising the lowermost battery cell group to the transmission section.

The battery monitoring system according to the sixth aspect of the present invention includes the battery monitoring apparatus according to anyone of the first to fifth aspects of the present invention and the upper controller.

Advantageous Effects of Invention

According to the inventive battery monitoring apparatus to transmit/receive information through a radio signal, power consumption can be reduced as well as reliability can be enhanced.

BRIEF DESCRIPTION OF DRAWINGS

FIG. 9 is a block diagram of the battery monitoring apparatuses BM1, BM2 and BM3 according to the second embodiment of the present invention.

DESCRIPTION OF EMBODIMENTS

First Embodiment

Figure 1:
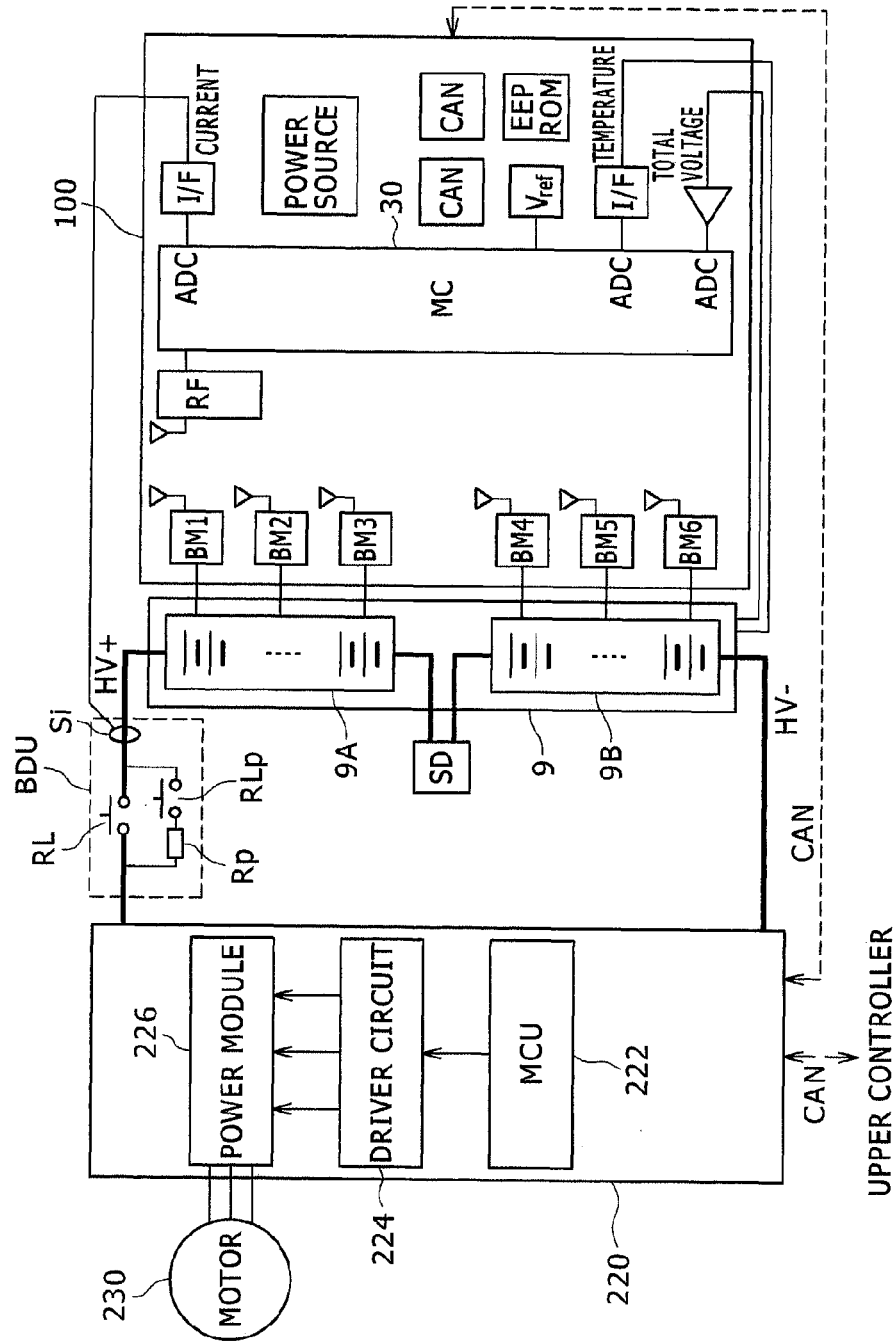
FIG. 1 is block diagram showing the driving system of a rotary electric machine for a vehicle according to a first embodiment of the present invention.

Hereinafter, the first embodiment of the present invention is explained with reference to the accompanying drawings. FIG. 1 is a block diagram showing the driving system of a rotary electric machine for a vehicle according to the present embodiment. The driving system shown in FIG. 1 includes: a battery module 9, a battery monitoring system 100 to monitor the battery module 9; an inverter apparatus 220 to convert a DC power from the battery module 9 into a three-phase AC power; and a motor 230 for driving a vehicle. The motor 230 is driven with the three-phase AC power from the inverter apparatus 220. The inverter apparatus 220 is connected to the battery monitoring system 100 through CAN communication, in which the inverter apparatus 220 functions as an upper controller for the battery monitoring system 100. Further, the inverter apparatus 220 operates based on a piece of instruction information derived from a further upper controller (not shown in the drawings).

The inverter apparatus 220 includes a power module 226, a driver circuit 224 to drive the power module 226 and an MCU 222 to control the driver circuit 224. The power module 226 converts a DC power supplied from the battery module 9 into a three-phase AC power for driving the motor 230. A high capacity smoothing capacitor in the order of approximately 700 µF to approximately 2000 µF, not shown, is provided between heavy electric lines HV+ and HV− in which the power module 226 is connected to the battery module 9. This smoothing capacitor acts as alleviating voltage noise applied to the integrated circuit provided in the battery monitoring system 100.

Since the electric charge of the smoothing capacitor is substantially zero in the state where the inverter apparatus 220 starts to operate, large initial current flows from the battery module 9 to the smoothing capacitor when the relay RL of the battery disconnect unit BDU as mentioned below is closed. There is a likelihood that such large current might cause the relay RL to be fused and damaged. In order to solve such a problem, the MCU 222 firstly causes the pre-charge relay RLP to be shifted from its opened state to its closed state so as to make the smoothing capacitor electrically charged upon the motor 230 starting according to a command from the further upper controller. At this time, the smoothing capacitor is electrically charged while the maximum current is checked in control through the resistor RP. Thereafter, with the relay RL shifted from its opened state to its closed state, the power supply from the battery module 9 to the inverter apparatus 220 begins. Such operational countermeasures allow the relay circuit to be protected as well as the maximum current flowing through the battery module 9 and the inverter apparatus 220 to be reduced below a predetermined value, with the result that higher safety is guaranteed.

The inverter apparatus 220 controls the phase of AC power generated through the power module 226 for the rotor of the motor 230 so as to make the motor 230 operate as a generator when a vehicle is braked. That is to say, regenerative braking control is performed, in which the power generated through the driving of the generator is regenerated to the battery module 9 so as to make the battery module 9 electrically charged. Also when the state of charge of the battery module 9 is worsened than its standard state, the inverter apparatus 220 makes the motor 230 operate as a generator. The three-phase AC power generated at the motor 230 is converted into DC power by the power module 226 so as to be supplied to the battery module 9. As a result of it, the battery module 9 is electrically charged.

When the battery module 9 is electrically charged through the regenerative braking control, the MCU 222 controls the driver circuit 224 such that a phase-lag rotating magnetic field is generated for the rotation of the rotor of the motor 230. According to such control, the driver circuit 224 controls the switching operation of the power module 226. Thereby, an AC power from the motor 230 is supplied to the power module 226 and converted into a DC power by the power module 226 so as to be supplied to the battery module 9. As a result, the motor 230 operates as a generator.

On the other hand, when the motor 230 is run by power, the MCU 222 controls the driver circuit 224 such that a phase-lead rotating magnetic field is generated for the rotation of the rotor of the motor 230 according to a command from the upper controller. According to such control, the driver circuit 224 controls the switching operation of the power module 226. Thereby, DC power from the battery module 9 is supplied to the power module 226 and is converted into AC power by the power module 226 so as to be supplied to the motor 230.

The power module 226 of the inverter apparatus 220 performs power conduction and power cut-off operations with high speed so as to engage in power conversion between a DC power and an AC power. At this time, large current is cut off with high speed, so that large voltage fluctuation occurs through the inductance inherent in a DC circuit. In order to constrain such voltage fluctuation, the inverter apparatus 220 includes the afore-mentioned high capacity smoothing capacitor.

The battery module 9 is arranged with plural battery module blocks. According to an example shown in FIG. 1, the battery module 9 configures two battery module blocks 9A and 9B connected in series. The respective battery module blocks 9A and 9B include plural cell groups connected in series, in each of groups which plural battery cells are connected in series. The battery module block 9A and the battery module block 9B are connected in series through the service disconnect SD for maintenance and inspection in which switches and fuses are connected in series. Opening this service disconnect SD permits the series circuit between the battery module blocks 9A and 9B to be cut off, so that even when there arises a circuit connection at one spot anywhere in any of the battery module blocks 9A and 9B with a vehicle, there is no way that current might flow there through. Such arrangement permits higher safety to be secured. Further, in the aspect of safety, opening the service disconnect SD at inspection prevents a higher voltage to be applied to a human body even when an operator might touch a space between heavy electric lines HV+ and HV−.

At the heavy electric line HV+ between the battery module 9 and the inverter apparatus 220, a battery disconnect unit BDU provided with a relay RL, a resistor RP and a pre-charge relay RLP is disposed. The series circuit between the resistor RP and the pre-charge relay RLP is connected in parallel with the relay RL.

As for the battery monitoring system 100, the monitoring operations of which to monitor the state of the battery module 9 mainly includes the measurements of a voltage of each cell of the battery module 9, a total voltage, a current, a cell temperature and the adjustments of a capacitance of each cell and as such. For that purpose, the battery monitoring system 100 includes plural battery monitoring apparatuses BM1 to BM6 and a microcomputer 30 to control the respective battery monitoring apparatuses BM1 to BM6. The battery cells provided within the respective battery module blocks 9A and 9B are divided into plural cell groups (assembled batteries). For the respective battery cell groups of the battery monitoring system 100, the respective battery monitoring apparatuses BM1 to BM6 to monitor the battery cells included in the respective battery cell groups are provided. The microcomputer 30 functions as an upper controller for those battery monitoring apparatuses BM1 to BM6.

To simplify the explanation hereof, it is provided herein that the respective cell groups comprise four battery cells connected in series. Further, it is assumed that the respective battery module blocks 9A and 9B comprise three cell groups. However, the number of the battery cells included in the respective cell groups is not limited to four, but may be five or more whereas it may be three or less. One cell group may well include one battery cell. That is to say, the respective cell groups comprising one battery cell or plural battery cells connected in series correspond to the respective batteries monitored by the respective battery monitoring apparatuses BM1 to BM6. Further, it may be such that the cell groups having a different number of battery cells, for instance, a cell group having four battery cells and that having six battery cells are combined. As for the battery monitoring apparatuses BM1 to BM6 correspondingly provided to the respective cell groups, such apparatuses are selectable as designed such that they are feasible to use irrespectively of the arbitrary number of the battery cells included in the respective cell groups, for example, even when such number might be either four or five or more.

Moreover, in order to secure voltage and current required for an electric car or a hybrid car, as mentioned above, in the respective battery module blocks, the cell groups may be connected in series or series-parallel arrangement. Furthermore, the battery module blocks may be connected in series or series-parallel arrangement.

The respective battery monitoring apparatuses BM1 to BM6 have an antenna to effect radio communication with the microcomputer 30. The microcomputer 30 is connected to a radio communication section RF provided with an antenna. Through this radio communication section RF, the microcomputer 30 effects radio communication with the respective battery monitoring apparatuses BM1 to BM6 so as to direct the respective battery monitoring apparatuses BM1 to BM6 to monitor the states of the corresponding cell groups. Further, the microcomputer receives the monitoring results of the respective cell groups transmitted from the respective battery monitoring apparatuses BM1 to BM6.

The radio signal transmitted to the respective battery monitoring apparatuses BM1 to BM6 through the radio communication section RF from the microcomputer 30 includes apiece of ID information to designate which battery monitoring apparatus among them shall execute monitoring operation and a piece of command information to designate the contents of such monitoring operation executed by the battery monitoring apparatus designated based on such ID information for its corresponding cell groups. The radio communication section RF modulates such pieces of information output from the microcomputer 30 through a prescribed modulation system so as to generate a radio signal and to transmit such radio signal to the respective battery monitoring apparatuses BM1 to BM6. A radio signal transmitted from the microcomputer 30 may be encoded where necessary. For instance, a radio signal encoded with such ID information in use for a key generation seed can be transmitted from the microcomputer 30. In this case, the encoded radio signal can be deciphered by the battery monitoring apparatus having an ID corresponding to such key generation seed among the battery monitoring apparatuses BM1 to BM6.

Within the battery disconnect unit BDU, a current sensor Si such as a Hall element is disposed. The output of the current sensor Si is inputted to the microcomputer 30. Signals regarding the total voltage and temperature of the battery module 9 are also inputted to the microcomputer 30 to be measured by an AD converter (ADC) of the microcomputer 30. Temperature sensors are provided at several spots within the respective battery module blocks 9A and 9B.

Figure 2:
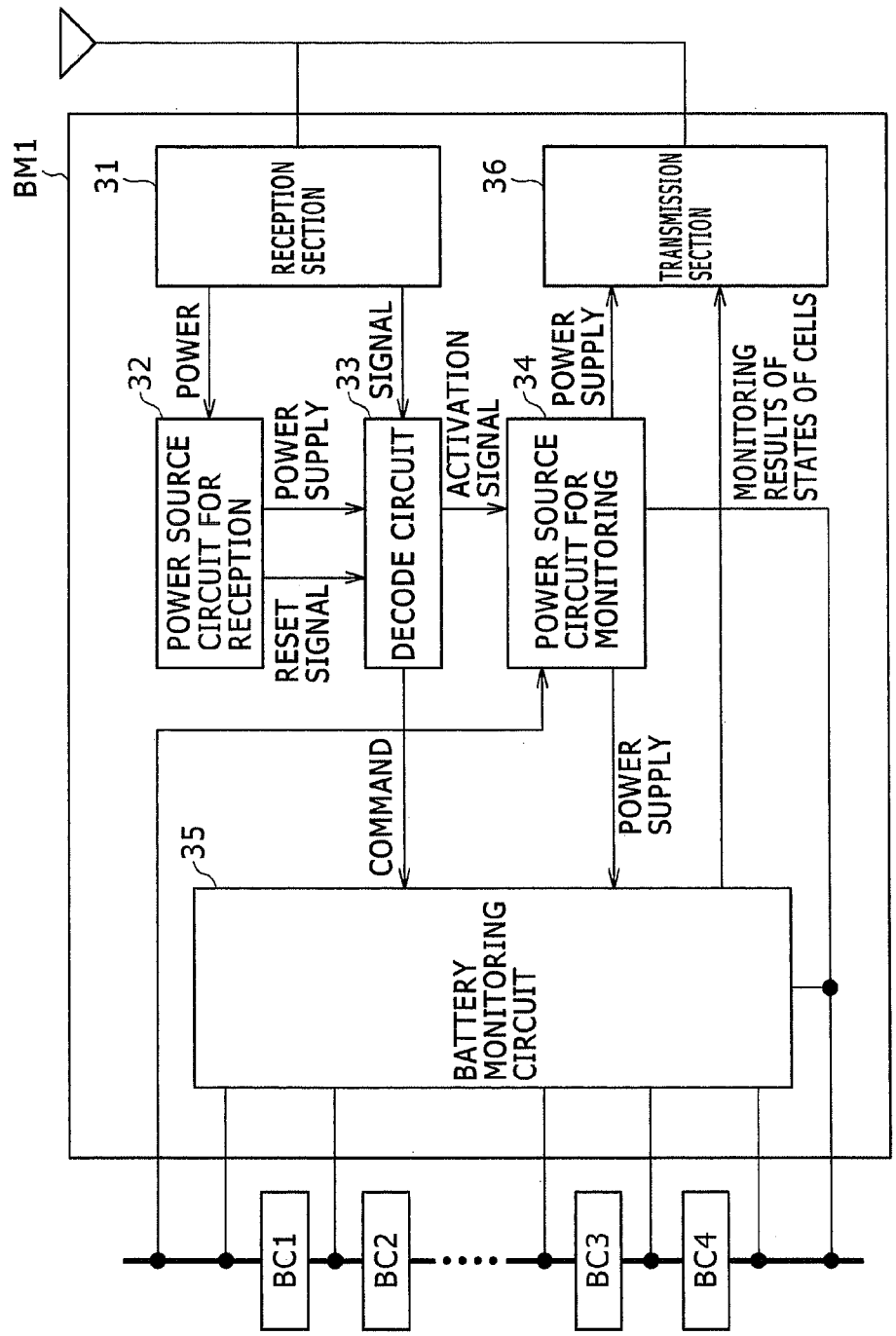
FIG. 2 is a block diagram of a battery monitoring apparatus BM1 according to the first embodiment of the present invention.

FIG. 2 is a block diagram showing the arrangement of the battery monitoring apparatus BM1 according to the first embodiment of the present invention. The other battery monitoring apparatuses BM2 to BM6 have the similar arrangement to that of the battery monitoring apparatus BM1, the explanations of which are omitted for redundancy.

As shown in FIG. 2, the battery monitoring apparatus BM1 includes a reception section 31, a power source circuit for reception 32, a decode circuit 33, a power source circuit for monitoring 34, a battery monitoring circuit 35 and a transmission section 36. It is preferred that at least the power source circuit for monitoring 34 and the battery monitoring circuit 35 among them be arranged as circuits on the same IC in light of the reasons given in the second embodiment presented below.

The reception section 31 receives a radio signal transmitted from the microcomputer 30 and outputs power gained through such radio signal to the power source circuit for reception 32. Further, the reception section demodulates the received radio signal and outputs the demodulated signal to the decode circuit 33. The reception section 31 is composed of a rectifier circuit and a demodulator, for example.

The power source circuit for reception 32 supplies power to the decode circuit 33 based on power output from the reception section 31. When the power output from the reception section 31 goes beyond a prescribed threshold value, the power source circuit for reception 32 outputs a reset signal to the decode circuit 33 so as to make the decode circuit 33 start to operate.

The decode circuit 33 performs authentication processing for confirming whether or not the received radio signal is that transmitted from the microcomputer 30 to the battery monitoring apparatus BM1 based on the afore-mentioned ID information contained in a demodulated signal output from the reception section 31. According to the result of such authentication processing, the decode circuit 33 outputs an activation signal to the power source circuit for monitoring 34 as well as outputs a command based on the afore-mentioned command information contained in the demodulated signal to the battery monitoring circuit 35.

The operation in which the reception section 31 outputs the power gained by receiving the radio signal transmitted from the microcomputer 30 to the power source circuit for reception 32 leads to the power supply from the power source circuit for reception 32, and upon the afore-mentioned reset signal being output from the power source circuit for reception 32, the decode circuit 33 starts the above-mentioned operations. On the other hand, when the transmission of the radio signal from the microcomputer 30 is halted, it leads to the power supply from the power source circuit for reception 32 being halted as well, thereby, the decode circuit 33 stopping to operate. Namely, while the radio signal is being transmitted from the microcomputer 30, the decode circuit 33 operates according to the power gained through the radio signal.

The power source circuit for monitoring 34, upon the afore-mentioned activation signal being output from the decode circuit 33, is activated according to such activation signal so as to start supplying power to the battery monitoring circuit 35 and the transmission section 36. The power supply from the power source circuit for monitoring 34 is effected with the power of the battery cells BC1 to BC4, with which the battery monitoring apparatus BM1 is connected, in use.

The battery monitoring circuit 35 is connected to the battery cells BC1 to BC4 constituting the cell group corresponding to the battery monitoring apparatus BM1 and performs monitoring operation for monitoring the states of the battery cells BC1 to BC4 according to a command output from the decode circuit 33. At this time, among the aforementioned various monitoring operations, the battery monitoring circuit 35 effects a monitoring operation corresponding to a content designated by the command output from the decode circuit 33 on the battery cells BC1 to BC4. Namely, the content of the monitoring operation performed by the battery monitoring circuit 35 is determined in such a manner that a command is output from the decode circuit 33 to the battery monitoring circuit 35 based on a piece of command information contained in the radio signal transmitted from the microcomputer 30. When the battery monitoring circuit 35 is over with such monitoring operation on the battery cells BC1 to BC4, it outputs its results to the transmission section 36 in the form of the monitoring results of the states of the cells. The battery monitoring circuit 35 operates according to the power supply from the power source circuit for monitoring 34.

The transmission section 36 generates a radio signal by modulating the monitoring results of the states of the cells output from the battery monitoring circuit 35 according to a prescribed modulation system so as to transmit the radio signal to the radio signal to the microcomputer 30 shown in FIG. 1. The operation in which the microcomputer 30 receives the radio signal transmitted from the transmission section 36 through the radio communication section RF allows the microcomputer 30 to acquire the monitoring results of the battery cells BC1 to BC4 from the battery monitoring apparatus BM1. The transmission section 36 operates according to the power supply from the power source circuit for monitoring 34.

Figure 3:
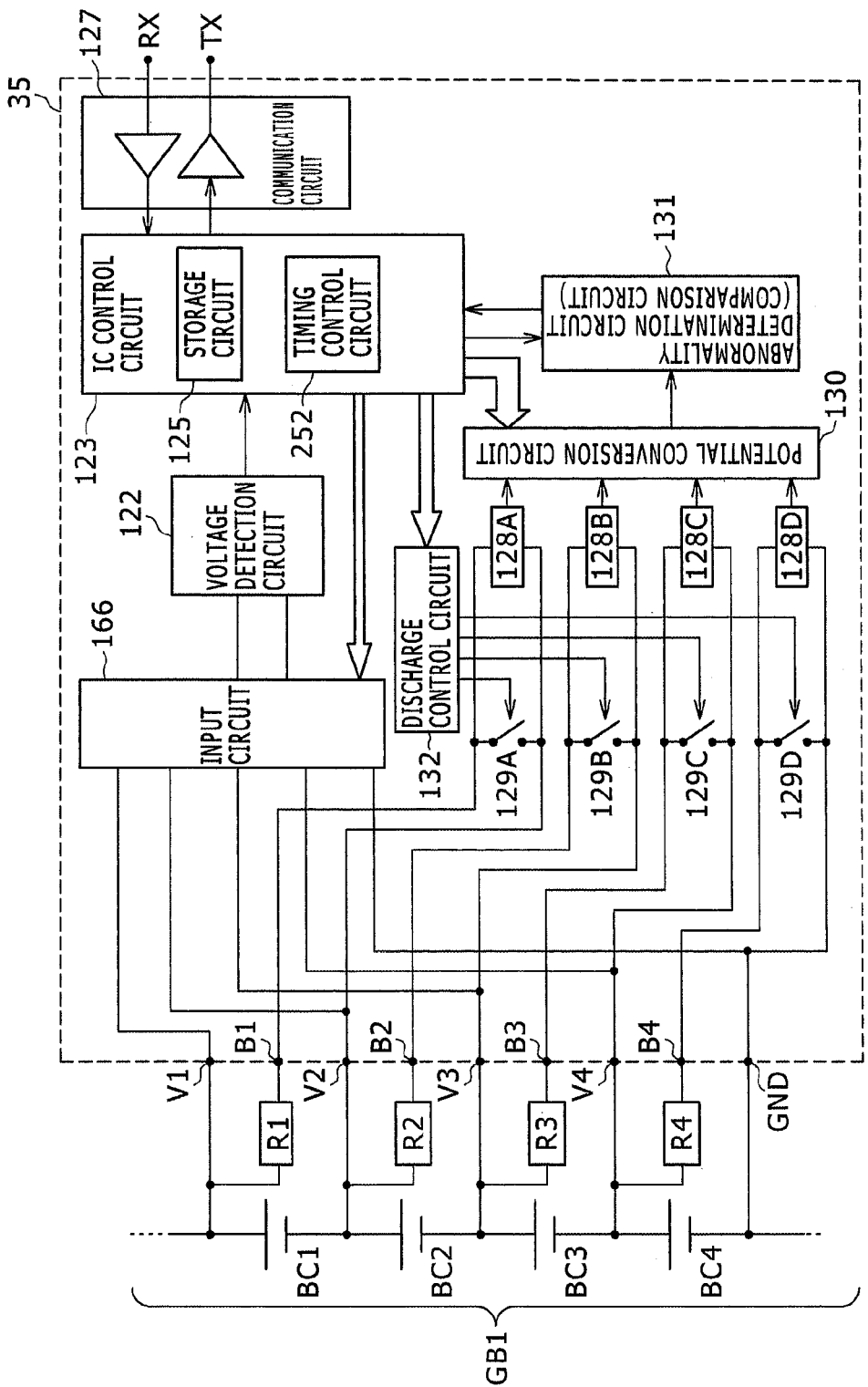
FIG. 3 is a block diagram of a battery monitoring circuit 35.

FIG. 3 is an internal block diagram of the battery monitoring circuit 35 of the battery monitoring apparatus BM1. The battery monitoring circuits 35 of the other battery monitoring apparatuses BM2 to BM6 have the similar block diagram to that of the battery monitoring circuit of the battery monitoring apparatus BM1, the explanations of which are omitted for redundancy.

The battery module block 9A shown in FIG. 1 is divided into three cell groups in correspondence with the battery monitoring apparatuses BM1 to BM3. In the cell group GB1 corresponding to the battery monitoring apparatus BM1, four battery cells BC1 to BC4 shown in FIG. 2 are included.

The respective input side terminals of the battery monitoring circuit 35 are connected to the respective battery cells BC1 to BC4 constituting the cell group GB1. The positive terminal of the battery cell BC1 is connected through an input terminal V1 with an input circuit 116. This input circuit 116 incorporates a multiplexer. The negative terminal of the battery cell BC1 along with the positive terminal of the battery cell B2 are connected through an input terminal V2 with the input circuit 116; the negative terminal of the battery cell BC2 along with the positive terminal of the battery cell BC3 are connected through an input terminal V3 with the input circuit 116; and the negative terminal of the battery cell BC3 along with the positive terminal of the battery cell BC4 are connected through an input terminal V4 with the input circuit 116. The negative terminal of the battery cell BC4 is connected to a terminal GND of the battery monitoring circuit 35.

The voltage detection circuit 122 has a circuit to convert each terminal-to-terminal voltage of the respective battery cells BC1 to BC4 into a digitalized value. The respective terminal-to-terminal voltages converted into digitalized values are transmitted to an IC control circuit 123 so as to be held in an internal storage circuit 125. Those voltages are utilized for the purposes of the self-examination and as such or transmitted to the microcomputer 30 shown in FIG. 1.

The IC control circuit 123 has a computing function as well as includes a storage circuit 125 and a timing control circuit 252 to detect various types of voltage and to periodically conduct condition monitoring. The storage circuit 125 is composed of a register circuit, for example. The respective terminal-to-terminal voltages of the respective battery cells BC1 to BC4 detected at the voltage detection circuit 122 are stored in the storage circuit 125 of the IC control circuit 123 in such a manner that they correspond to the respective battery cells BC1 to BC4. Further, as for the other various detected values as well, they can be retained in a predetermined address of the storage circuit 125 in such a manner that they are retrievable.

A communication circuit 127 is connected to the IC control circuit 123. The IC control circuit 123 is arranged such that the command derived from the microcomputer 30 and output from the decode circuit 33 shown in FIG. 2 is inputted therein through this communication circuit 127 as well as it outputs the monitoring results of the states of the cells to the transmission section 36 so as to make the transmission section 36 transmit such results to the microcomputer 30. When the command is transmitted from the decode circuit 33 thereto, the IC control circuit 123 decodes the content of such command and performs an operation according to such content. The commands derived from the microcomputer 30 include that to request the measured values of the respective terminal-to-terminal voltages of the respective battery cells BC1 to BC4; that to request discharge operation for adjusting the state of charges of the respective battery cells BC1 to BC4; that (Wake Up) to start the operation of the battery monitoring apparatus BM1; that to halt an operation (Sleep); and that to request an address setting, for example.

The positive terminal of the battery cell BC1 is connected through a resistor R1 to a terminal B1 of the battery monitoring circuit 35. Between the terminal B1 and the terminal V2, a balancing switch 129A is provided. It is an operational condition detection circuit 128A that is connected in parallel with the balancing switch 129A to detect the operational condition of such switch. This balancing switch 129A is switched on/off under the control of a discharge control circuit 132. In the same way, the positive terminal of the battery cell BC2 is connected through a resistor R2 to a terminal B2, and between the terminal B2 and the terminal V3, a balancing switch 129B is provided. It is an operational condition detection circuit 128B that is connected in parallel with the balancing switch 129B to detect the operational condition of such switch. This balancing switch 129B is switched on/off under the control of the discharge control circuit 132.

The positive terminal of the battery cell BC3 is connected through a resistor R3 to a terminal B3, and between the terminal B3 and a terminal V4, a balancing switch 129C is provided. It is an operational condition detection circuit 128C that is connected in parallel with the balancing switch 129C to detect the operational condition of such switch. This balancing switch 129C is switched on/off under the control of the discharge control circuit 132. The positive terminal of the battery cell BC4 is connected through a resistor R4 to a terminal B4, and between the terminal B4 and a terminal GND, a balancing switch 129D is provided. It is an operational condition detection circuit 128D that is connected in parallel with the balancing switch 129D to detect the operational condition of such switch. This balancing switch 129D is switched on/off under the control of the discharge control circuit 132.

The operational condition detection circuits 128A to 128D repeatedly detect voltages at both ends of the corresponding balancing switches 129A to 129D with a prescribed period and checks whether or not those switches 129A to 129D operate normally. The balancing switches 129A to 129D are intended for adjusting the state of charges of the corresponding battery cells BC1 to BC4. When there is abnormality in those switches, the state of charges of the battery cells result in being uncontrollable, so that there is likelihood that some of those battery cells might be overcharged or over-discharged. For instance, in spite that a certain balancing switch is in the state of being electrically conducted, when its terminal-to-terminal voltage indicates the terminal voltage of the corresponding battery cell, the corresponding operational condition detection circuit determines that such balancing switch is in an abnormal state. In this case, such balancing switch is regarded as not in the electrically conducted state based on a control signal. Further, in spite that a certain balancing switch is in an open state, also when its terminal-to-terminal voltage is lower in value than the terminal voltage of the corresponding battery cell, the corresponding operational condition detection circuit determines that such balancing switch is in an abnormal state. In this case, such balancing switch is regarded as being electrically conducted irrespectively of whether or not there is a control signal. For such operational condition detection circuits 128A to 128D to detect abnormality of the corresponding balancing switches 129A to 129D, a voltage detection circuit comprising a differential amplifier and so forth is adopted, for example.

The balancing switches 129A to 129D each include a MOSFET, for example, and act as discharging power accumulated in the corresponding battery cells BC1 to BC4. Upon an electric load of an inverter and as such being connected to the battery module 9 in which a number of battery cells are connected in series, current supply for such electric load is carried out by a number of battery cells connected in series as a whole. At this time, when each of the battery cells is in a different state of charge (SOC) from each other, it results that current is restricted according to the state of the battery cell that is discharged most in the battery module 9. On the other hand, in the state where the battery module 9 is charged, current supply to the battery module 9 is carried out for a number of battery cells connected in series as a whole. At this time, when each of the battery cells is in a different state of charge (SOC) from each other, it results that current is restricted according to the state of the battery cell that is discharged most in the battery module 9. On the other hand, in the state in which the battery module 9 is charged, current supply to the battery module 9 is performed for a number of battery cells connected in series as a whole. At this time, when each of the battery cells is in a different state of charge (SOC), it results that current is restricted according to the state of the battery cell that is charged most in the battery module 9.

Thus, to overcome the problem as mentioned above in which current is restricted according to the difference of the state of charge of each of the battery cells, the following balancing is carried out where necessary. Specifically, among a number of battery cells connected in series in the battery module 9, the corresponding balancing switches that are connected to some of the battery cells whose state of charge goes beyond a prescribed state of charge, for instance, an average value of the state of charge of each of the battery cells, are brought into the state of being electrically conducted. Thereby, through a resistor connected in series to each of such balancing switches brought into the state of being electrically conducted, discharge current is flowed from such battery cells whose state of charge goes beyond such average value. As a result of it, it is controlled such that the state of charge of each of the battery cells are rendered similar to each other. In turn, there is another method in which the battery cell that is in the state of being discharged most in the battery module 9 is defined as a standard cell and discharge time is determined based on difference of the state of charge with this standard cell. Besides, various balancing methods are also available to adjust the state of charges of each of the battery cells. The state of charge of each of the battery cells can be calculated based on its terminal voltage. Since there is relationship between the state of charge of each of the battery cells and its terminal voltage, controlling the balancing switches 129A to 129D such that the terminal voltages of the battery cells are rendered similar to each other allows the state of charges of the battery cells to be rendered similar to each other.

The terminal-to-terminal voltages of the balancing switches 129A to 129D, namely, that between a source and a drain of the respective FETs comprising the balancing switches 129A to 129D is detected by each of the corresponding operational condition detection circuits 128A to 128D so as to be output to a potential conversion circuit 130. Hereupon, the potentials between a source and a drain of each FET differ from each other with respect to a standard potential, so that comparison is hard to make. Thus, those potential are aligned with each other at the potential conversion circuit 130, and any abnormality of such balancing switches is determined at an abnormality determination circuit 131. Further, the potential conversion circuit 130 has a function to select a balancing switch among the balancing switches 129A to 129D to be examined based on a control signal derived from the IC control circuit 123. Upon the terminal-to-terminal voltage of the selected balancing switch being transmitted from the potential conversion circuit 130 to the abnormality determination circuit 131, the abnormality determination circuit 131 compares such terminal-to-terminal voltage with a prescribed determination voltage based on a control signal derived from IC control circuit 123. Thereby, the abnormality determination circuit 131 can determine whether or not the balancing switches 129A to 129D are in an abnormal state.

To the discharge control circuit 132, a command signal to make a balancing switch, which corresponds to the battery cell to be discharged, electrically conducted is transmitted from the IC control circuit 123. Based on such command signal, the discharge control circuit 132 outputs a signal corresponding to a gate voltage to enable the balancing switches 129A to 129D each comprising a MOSFET as mentioned above to be electrically conducted.

The IC control circuit 123 receives an instruction of discharge duration corresponding to the specific battery cell to be discharged through a command from the microcomputer 30 shown in FIG. 1 so as to execute the aforementioned discharge operation. Further, upon the IC control circuit 123 detecting abnormality of the balancing switches 129A to 129D, it outputs such detection result to the transmission section 36 in the form of the monitoring result of the state of the cell shown in FIG. 2 so as to make the transmission section 36 wirelessly transmit such result to the microcomputer 30.

Figure 4:
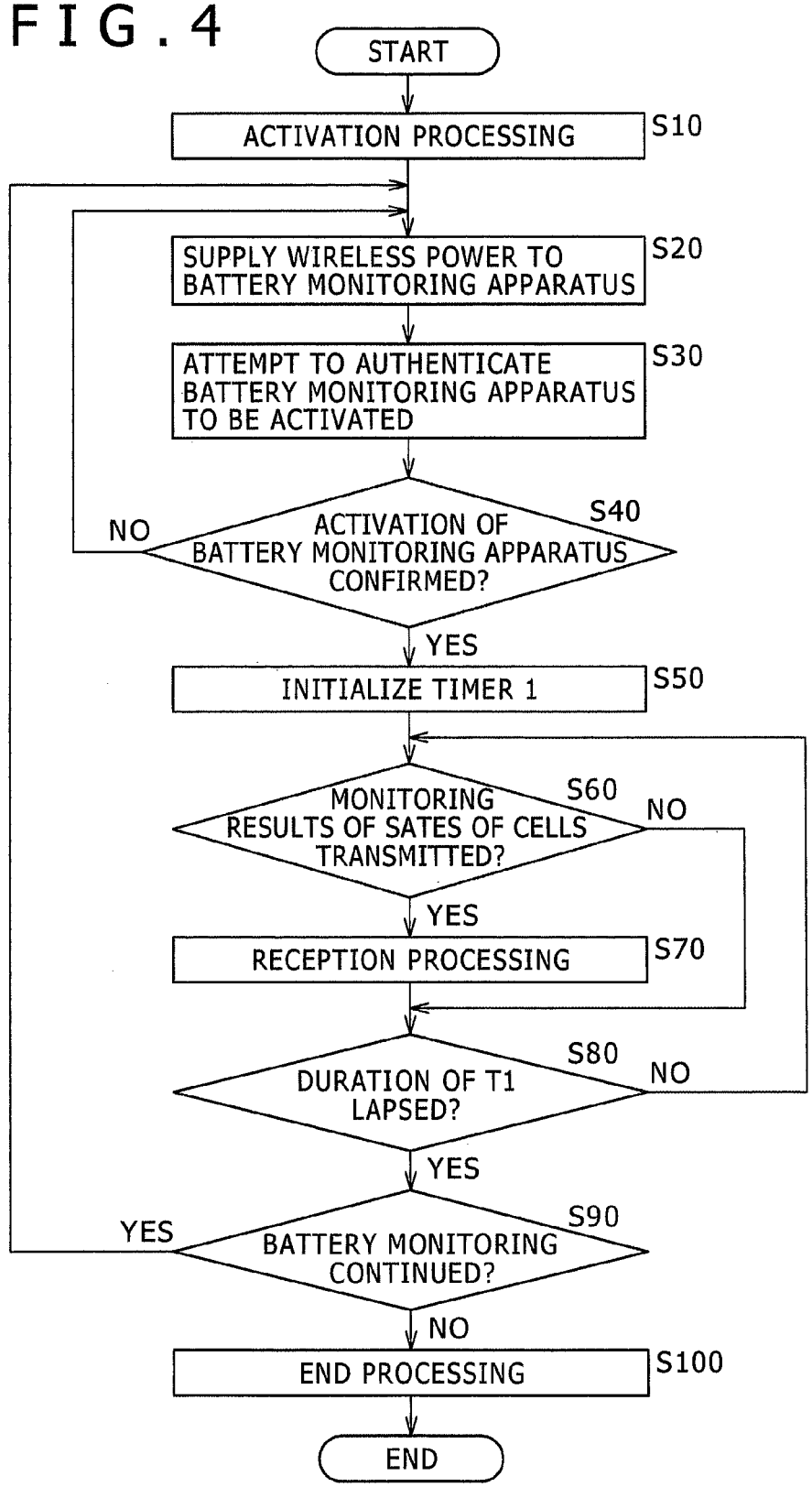
FIG. 4 is a flow chart showing the operational steps carried out by a microcomputer 30.

FIG. 4 is a flow chart showing the operational steps to be executed by the microcomputer 30. The microcomputer 30 starts to execute such steps as shown in the flow chart of FIG. 4 in accordance with an instruction from the inverter apparatus 220 or under the control of the timing control circuit 252.

At step S10, the microcomputer 30 executes a prescribed activation processing. When the microcomputer 30 is already activated, the activation processing at step S10 may be omitted.

At step S20, the microcomputer 30 transmits a prescribed radio signal through a radio communication section RF, thereby, supplying wireless power to the battery monitoring apparatuses BM1 to BM6. The transmitted radio signal is received by the respective reception sections 31 of the battery monitoring apparatuses BM1 to BM6 at step S110 shown in FIG. 5 and mentioned below, thereby, the wireless power being supplied to the battery monitoring apparatuses BM1 to BM6.

At step S30, the microcomputer 30 attempts to authenticate a battery monitoring apparatus willing to be activated among the battery monitoring apparatuses BM1 to BM6. Here, the microcomputer transmits through the radio communication section RF a radio signal containing a piece of ID information corresponding to the battery monitoring apparatus willing to be activated and a piece of command information to designate the content of the monitoring operation for such battery monitoring apparatus. Such authentication may be carried out simultaneously for plural battery monitoring apparatuses. At this time, the radio signal may be encoded with such ID information in use for a key generation seed as mentioned above. At each of the battery monitoring apparatuses BM1 to BM6, whether or not the radio signal received from the microcomputer 30 is transmitted to the battery monitoring apparatus in issue is determined through the authentication processing performed at steps S160 and S230 of FIG. 5 mentioned below. The steps S20 and S30 may be carried out simultaneously in such a manner that the radio signal containing such ID information and command information are transmitted to the battery monitoring apparatus willing to be activated when the wireless power is supplied thereto at step S20.

At step S40, the microcomputer 30 determines whether or not the activation of the battery monitoring apparatus for which authentication has been attempted at step S30 is confirmed. When the activation of such battery monitoring apparatus is confirmed through its response by return, it proceeds to step S50. On the other hand, when there is no response by return from such battery monitoring apparatus, it returns to step S20 and authentication is retried for such battery monitoring apparatus. At this time, when it cannot be confirmed beyond a prescribed number of attempts that such battery monitoring apparatus is activated, the operational steps may well end with the determination that the activation malfunctions.

At step S50, the microcomputer 30 initializes a timer 1 incorporated therein and starts counting with such timer 1.

At step S60, the microcomputer 30 determines whether or not the monitoring results of the states of the cells are transmitted from the battery monitoring apparatus which it is confirmed at step S40 is activated. When the monitoring results of the states of the cells are wirelessly transmitted from the transmission section 36 of such battery monitoring apparatus through the operation at step S340 shown in FIG. 6 mentioned below being executed at the battery monitoring circuit 35 of such battery monitoring apparatus, it proceeds to step S70. On the other hand, when the monitoring results of the states of the cells are not transmitted, it proceeds to step S80 without executing step S70.

At step S70, the microcomputer 30, upon receiving the monitoring results of the states of the cells from the battery monitoring apparatus, performs a prescribed reception processing. It records the received monitoring results of the states of the cells in its prescribed memory region or outputs such results through CAN communication to an upper inverter apparatus 220, for example. Further, the microcomputer may well perform a prescribed computing processing based on the received monitoring results of the states of the cells so as to make the afore-mentioned balancing instruction to the battery monitoring apparatuses BM1 to BM6 based on the computing result.

At step S80, the microcomputer 30 determines whether or not the count duration by the timer 1 has passed a prescribed time-out duration T1. When the count duration by the timer 1 is less than T1, it returns to step S60 while when it is T1 or more, it proceeds to step S90.

At step S90, the microcomputer 30 determines whether or not it continues to monitor the battery module 9. When the prescribed monitoring results of the states of the cells are not gained yet from the battery monitoring apparatuses BM1 to BM6, it returns to step S20 with the determination that it continues monitoring the battery module. In this case, the radio signal is transmitted from the microcomputer 30 to the battery monitoring apparatuses BM1 to BM6 with a transmission period of the time-out duration T1 through the steps from S20 to S80 as mentioned above being repeated. On the other hand, when all the prescribed monitoring results of the states of the cells are obtained, it proceeds to step S100 with the determination that it does not continue monitoring the battery module. It is preferred that the time-out duration T1 defined as the transmission period be arranged shorter than a time-out duration T2 used for the determination at step S250 of FIG. 5 mentioned below. Thereby, the microcomputer is able to transmit a radio signal before power supply from the power source circuit for monitoring 34 to the battery monitoring circuit 35 and the transmission section 36 is halted and to continue monitoring the corresponding battery cell.

At step S100, the microcomputer 30 performs a prescribed end processing. For instance, it records the computing processing result obtained at the reception processing at step S70 in a prescribed memory region or outputs such result through CAN communication to an upper inverter apparatus 220. If not required, the end processing at step S100 may be omitted.

After the microcomputer 30 executes step S100, it terminates processing shown in the flow chart of FIG. 4.

Figure 5:
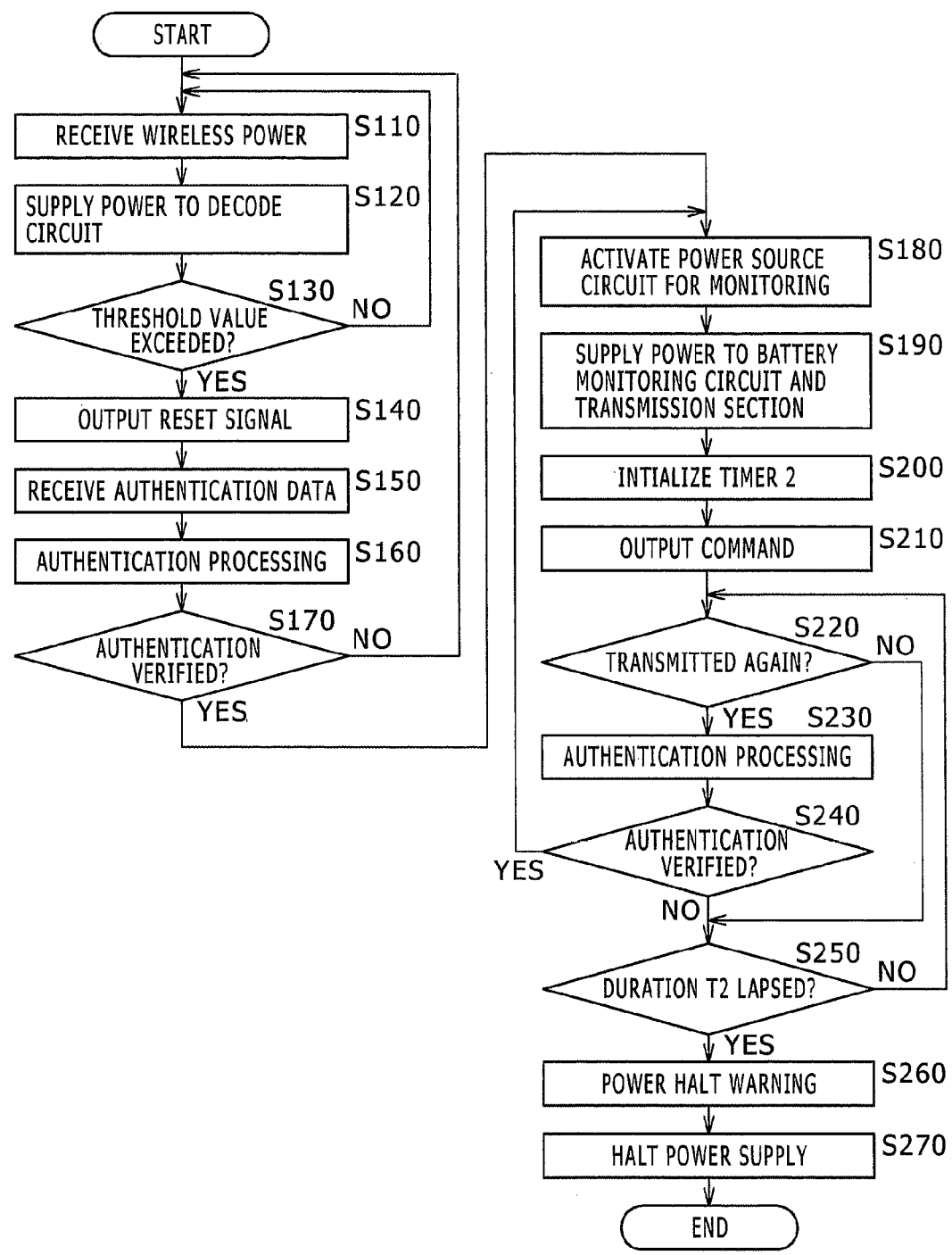
FIG. 5 is a flow chart showing the operational steps carried out by a reception section 31, a power source circuit for reception 32, a decode circuit 33 and a power source circuit for monitoring 34.

FIG. 5 is a flow chart showing the operational steps performed by the reception section 31, the power source circuit for reception 32, the decode circuit 33 and the power source circuit for monitoring 34. When wireless power is supplied from the microcomputer 30 at step S20 of FIG. 4, the reception sections 31 start processing shown in FIG. 5.

At step S110, the reception sections 31 receive wireless power supplied from the microcomputer 30. Here, the reception sections 31 receive a radio signal transmitted from the microcomputer 30, thereby, outputting wireless power based on such radio signal to the power source circuits for reception 32. The power source circuits for reception 32 start operating upon receiving such wireless power.

At step S120, the power source circuits for reception 32, supply power to the decode circuits 33 based on the wireless power received from the reception sections 31 at step S110.

At step S130, the power source circuits for reception 32 determine whether or not the wireless power received from the reception sections 31 at step S110 goes beyond a prescribed threshold value. If not, it returns to step S110; while if so, it proceeds to step S140.

At step S140, the power source circuits for reception 32 output a reset signal to the decode circuits 33. The decode circuits 33 start operating upon power being supplied thereto from the power source circuits for reception 32 at step S120 and further receiving the reset signal from the power source circuits for reception at step S140.

At step S150, the decode circuits 33 receive through the reception sections 31 a radio signal containing the authentication data transmitted from the microcomputer 30 at step S40 of FIG. 4 or that containing the afore-mentioned ID information and command information. Here, the decode circuits 33 are able to receive the authentication data in the form of a demodulated signal output from the reception sections 31.

At step S160, the decode circuits 33 perform authentication processing based on the authentication data received at step S150. This authentication processing is performed with an ID preliminarily and separately set for each of the battery monitoring apparatuses BM1 to BM6 in use. Specifically, the authentication processing at step S160 is performed by comparing a piece of ID information contained in the demodulated signal in the form of authentication data output from the reception section 31 with an ID inherent in the decode circuit 33 that is set for the battery monitoring apparatus on which the decode circuit 33 to execute the authentication processing is carried. As mentioned above, when the radio signal from the microcomputer 30 is encoded with a piece of ID information in use for a key generation seed, the authentication processing at step S160 can be performed by attempting to decode the demodulated signal encoded with an ID inherent in the decode circuit 33 to execute the authentication processing in use.

At step S170, the decode circuit 33 determines whether or not the authentication result through the authentication processing at step S160 is OK. When the ID information contained in the demodulated signal corresponds to the ID inherent in the decode circuit 33 to execute the authentication processing or the demodulated signal encoded with such ID in use is successfully decoded, it proceeds to step S180 with the determination that the authentication result is OK. On the other hand, when the ID information contained in the demodulated signal does not correspond to the ID inherent in the decode circuit 33 to execute the authentication processing or the demodulated signal encoded with such ID in use is unsuccessfully decoded, it returns to step S110 with the determination that the authentication result is not OK.

At step S180, the decode circuit 33 outputs an activation signal to the power source circuit for monitoring 34 so as to activate the power source circuit for monitoring 34. The power source circuit for monitoring 34 starts operating upon receiving such activation signal.

At step S190, the power source circuit for monitoring 34 supplies power to the battery monitoring circuit 35 and the transmission section 36.

At step S200, the power source circuit for monitoring 34 initializes a timer 2 incorporated therein and starts counting by the timer 2.

At step S210, the decode circuit 33 outputs a command to the battery monitoring circuit 35 based on the demodulated signal output from the reception section 31 in the form of authentication data at step S150. Namely, the decode circuit 33 outputs a command in accordance with the content of the monitoring operation designated by the command information contained in the demodulated signal to the battery monitoring circuit 35.

At step S220, the decode circuit 33 determines whether or not authentication data is transmitted again by the microcomputer 30. When such data is transmitted again, it proceeds to step S230 while if not, it proceeds to step S250.

At step S230, the decode circuit 33 performs the similar authentication processing to that at step S160 based on the authentication data transmitted again from the microcomputer 30.

At step S240, the decode circuit 33 determines whether or not the authentication result according to the authentication processing at step S240 is OK in the same way as the afore-mentioned step S170. When the authentication result is determined OK, it returns to step S180. In this case, an activation signal is output again from the decode circuit 33 to the power source circuit for monitoring 34, thereby, the power source circuit for monitoring 34 continuing operating. On the other hand, if the authentication result is determined not OK, it proceeds to step S250.

At step S250, the power source circuit for monitoring 34 determines whether or not the count duration by the timer 2 has passed the prescribed time-out duration T2. When the count duration by the timer 2 is less than T2, it returns to step S220 while when it is T2 or more, it proceeds to step S260.

At step S260, the power source circuit for monitoring 34 warns the battery monitoring circuit 35 that power is halted. The battery monitoring circuit 35 that has received such warning performs a prescribed end processing at step S360 of FIG. 6 mentioned below.

At step S270, the power source circuit for monitoring 34 halts power supply to the battery monitoring circuit 35 and the transmission section 36. Namely, when by a time when a prescribed time-out duration has passed since the power source circuit for monitoring is activated at step S180, the authentication result is determined OK according to the authentication processing at step S240 so that the operational step at step S180 is performed again while an activation signal is not output from the decode circuit 33 to the power source circuit for monitoring 34, the power source circuit for monitoring 34 performs the operational step at step S270, thereby, halting power supply to the battery monitoring circuit 35 and the transmission section 36.

After the power source circuit for monitoring 34 is over with the operational step at step S270, it ends the operational steps shown in the flow chart of FIG. 5.

Figure 6:
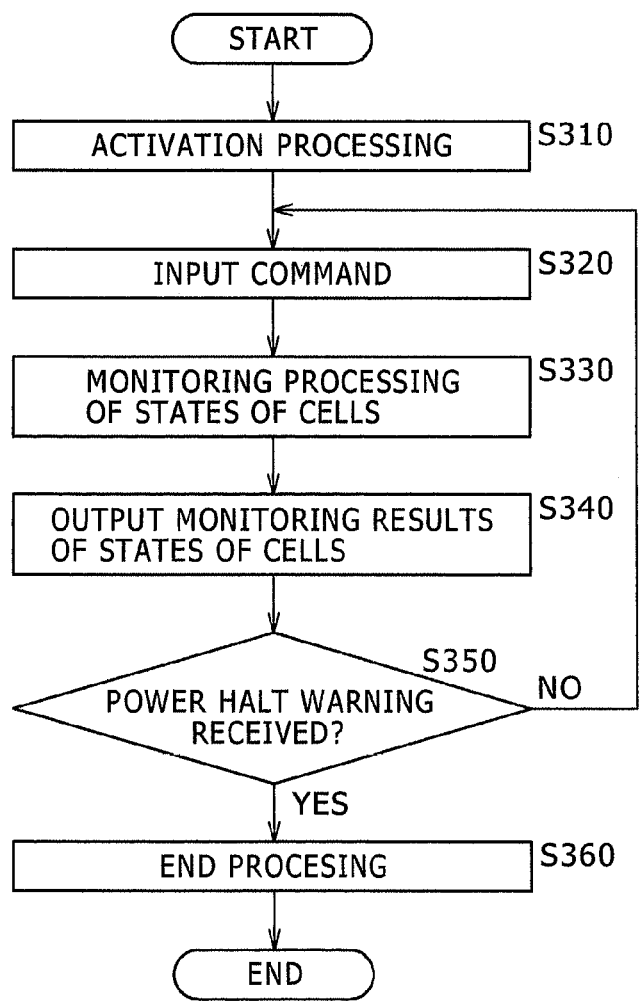
FIG. 6 is a flow chart showing the operational steps carried out by the battery monitoring circuit 35.

FIG. 6 is a flow chart showing the operational steps performed by the battery monitoring circuit 35. The battery monitoring circuit 35 starts the operational steps shown in a flow chart of FIG. 6 upon receiving an activation signal output from the decode circuit 33 at step S180 of FIG. 5.

At step S310, upon power supply being resumed to the battery monitoring circuit 35 from the power source circuit for monitoring 34 at step S190 of FIG. 5, the battery monitoring circuit performs a prescribed activation processing accordingly.

At step S320, a command output from the decode circuit 33 at step S210 of FIG. 5 is inputto the battery monitoring circuit 35.

At step S330, the battery monitoring circuit 35 performs the monitoring operation of the states of the cells according to the command inputthereto at step S320. Here, the battery monitoring circuit 35 performs such monitoring operation by carrying out an operation designated by such command among the afore-mentioned monitoring operations for the battery cells BC1 to BC4 (in the case of the battery monitoring apparatus BM1) connected thereto.

At step S340, the battery monitoring circuit 35 outputs the monitoring processing results of the states of the cells performed at step S330 to the transmission sections 36 in the form of the monitoring results of the states of the cells. Thereby, such results are wirelessly transmitted from the transmission section 36 to the microcomputer 30.

At step S350, the battery monitoring circuit 35 determines whether or not it has received a warning from the power source circuit for monitoring 34 that power supply is halted. When the battery monitoring circuit 35 has received such warning from the power source circuit for monitoring 34 through the latter having carried out the operational step at step S260 of FIG. 5, it proceeds to step S360 while if not, it returns to step S320.

At step S360, the battery monitoring circuit 35 performs a prescribed end processing.

After the battery monitoring circuit 35 is over with the operational step at step S360, it ends the operational steps shown in a flow chart of FIG. 6.

Figure 7:
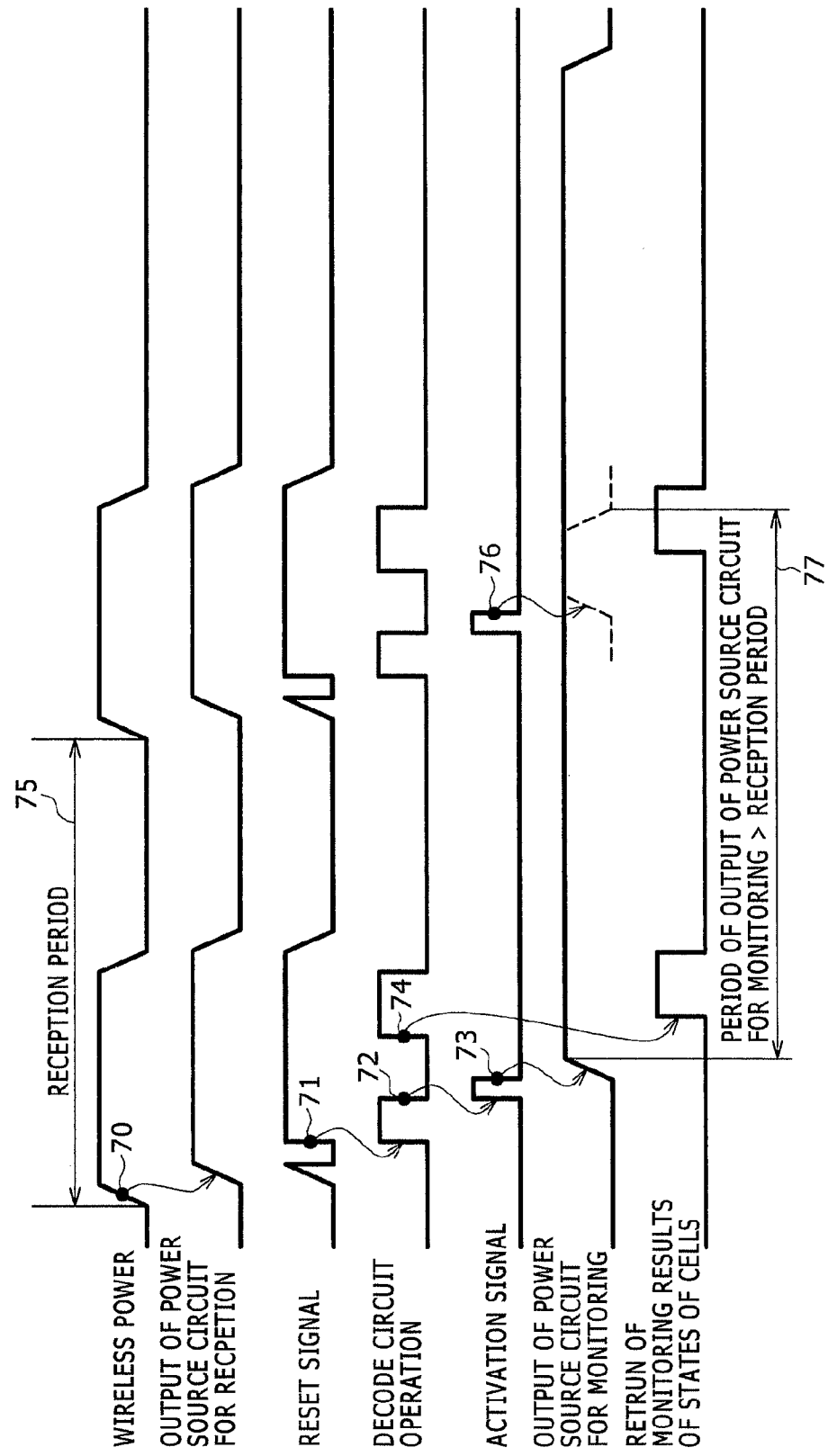
FIG. 7 is an illustration showing the timing chart of the battery monitoring apparatus BM1.

FIG. 7 is an illustration showing the timing chart of the battery monitoring apparatus BM1 when the afore-mentioned operational steps are executed. The battery monitoring circuits 35 of the other battery monitoring apparatuses BM2 to BM6 have the similar arrangement to that of the battery monitoring apparatus BM1, which explanations are omitted for redundancy.

At step S110, upon the reception section 31 receiving a radio signal transmitted from the microcomputer 30, wireless power is output from the reception section 31, according to which power supply from the power source circuit for reception 32 to the decode circuit 33 is carried out (chart reference 70). When such wireless power goes beyond a prescribed threshold value, a resent signal is output from the power source circuit for reception 32 to the decode circuit 33, according to which the decode circuit 33 starts to operate (chart reference 71).

When the result of the authentication processing performed at the decode circuit 33 is determined OK, an activation signal is output from the decode circuit 33 to the power source circuit for monitoring 34 (chart reference 72). According to the output activation signal, the power source circuit for monitoring 34 starts operating so as to start supplying power to the battery monitoring circuit 35 and the transmission section 36 (chart reference 73).

Upon a command being output from the decode circuit 33, the monitoring processing of the state of the cell according to such command is performed at the battery monitoring circuit 35 accordingly, which result is transmitted from the battery monitoring circuit 35 to the transmission section 36 (chart reference 74), Thereby, the monitoring result of the state of the cell is returned in response through wireless communication from the battery monitoring apparatus BM1 to the microcomputer 30.

Thereafter, when a radio signal transmitted from the microcomputer 30 with a reception period shown with the chart reference 75 is received again by the reception section 31, the same operational steps as above are repeated. At this time, an activation signal is output again from the decode circuit 33 to the power source circuit for monitoring 34 within the output period of the power source circuit for monitoring 34; thereby, power supply to the battery monitoring circuit 35 and the transmission section 36 continuing without the operation of the power source circuit for monitoring 34 being halted (chart reference 76). The output period of the power source circuit for monitoring 34 shown by the chart reference 77 is defined by the afore-mentioned time-out duration T2. This duration is longer than the reception period of a radio signal transmitted from the microcomputer 30 or the above-mentioned time-out duration T1.

The following operational effects are brought by the first embodiment of the present invention described above.

(1) Each of the battery monitoring apparatuses BM1 to BM6 comprises a reception section 31, a power source circuit for reception 32, a decode circuit 33, a power source circuit for monitoring 34, a battery monitoring circuit 35 and a transmission section 36. The reception section 31 receives a radio signal transmitted from the microcomputer 30 that is an upper controller and outputs power according to such radio signal and a demodulated signal based on such radio signal to the power source circuit for reception 32 and the decode circuit 33 respectively. The power source circuit for reception 32 supplies power to the decode circuit 33 based on power output from the reception section 31. The decode circuit 33 operates under the power supply from the power source circuit for reception 32 and performs authentication based on a demodulated signal output from the reception section 31 as well as outputs an activation signal and a command based on such demodulated signal to the power source circuit for monitoring and the battery monitoring circuit 35 respectively according to the authentication result. The power source circuit for monitoring 34 is activated in response to an activation signal output from the decode circuit 33 and supplies power to the battery monitoring circuit 35 and the transmission sections 36 based on power of each of the corresponding battery cells. The battery monitoring circuit 35 operates under the power supply from the power source circuit for monitoring 34 and outputs the monitoring results of the states of the corresponding battery cells to the transmission section 36 according to a command output from the decode circuit 33. The transmission section 36 operates under the power supply from the power source circuit for monitoring 34 and wirelessly transmits the monitoring results output from the battery monitoring circuit 35 to the microcomputer 30. This arrangement prevents the battery monitoring apparatuses BM1 to BM6 from being activated in error when they receive an unintended radio wave other than a radio signal transmitted from the microcomputer 30, so that the fluctuation of the cell voltage caused by the unintended discharge of the battery cells is restrained. Thus, the power consumption of the battery monitoring apparatus is reduced and the reliability thereof is enhanced.

(2) The power source circuit for monitoring 34 halts the power supply to the battery monitoring circuit 35 and the transmission section 36 when an activation signal is not output again to it from the decode circuit 33 by a time when a prescribed time-out duration T2 has passed since the power source circuit for monitoring is activated. This allows the power supply from the power source circuit for monitoring 34 to be automatically halted when the required monitoring operation is over, to avoid wasteful power consumption.

(3) The microcomputer 30 is able to transmit a radio signal with a period T1 shorter than the above-mentioned time-out duration T2. This permits a radio signal to be transmitted before the power supply from the power source circuit for monitoring 34 is halted and the monitoring operations required at the battery monitoring apparatuses BM1 to BM6 to continue.

Second Embodiment

Figure 8:
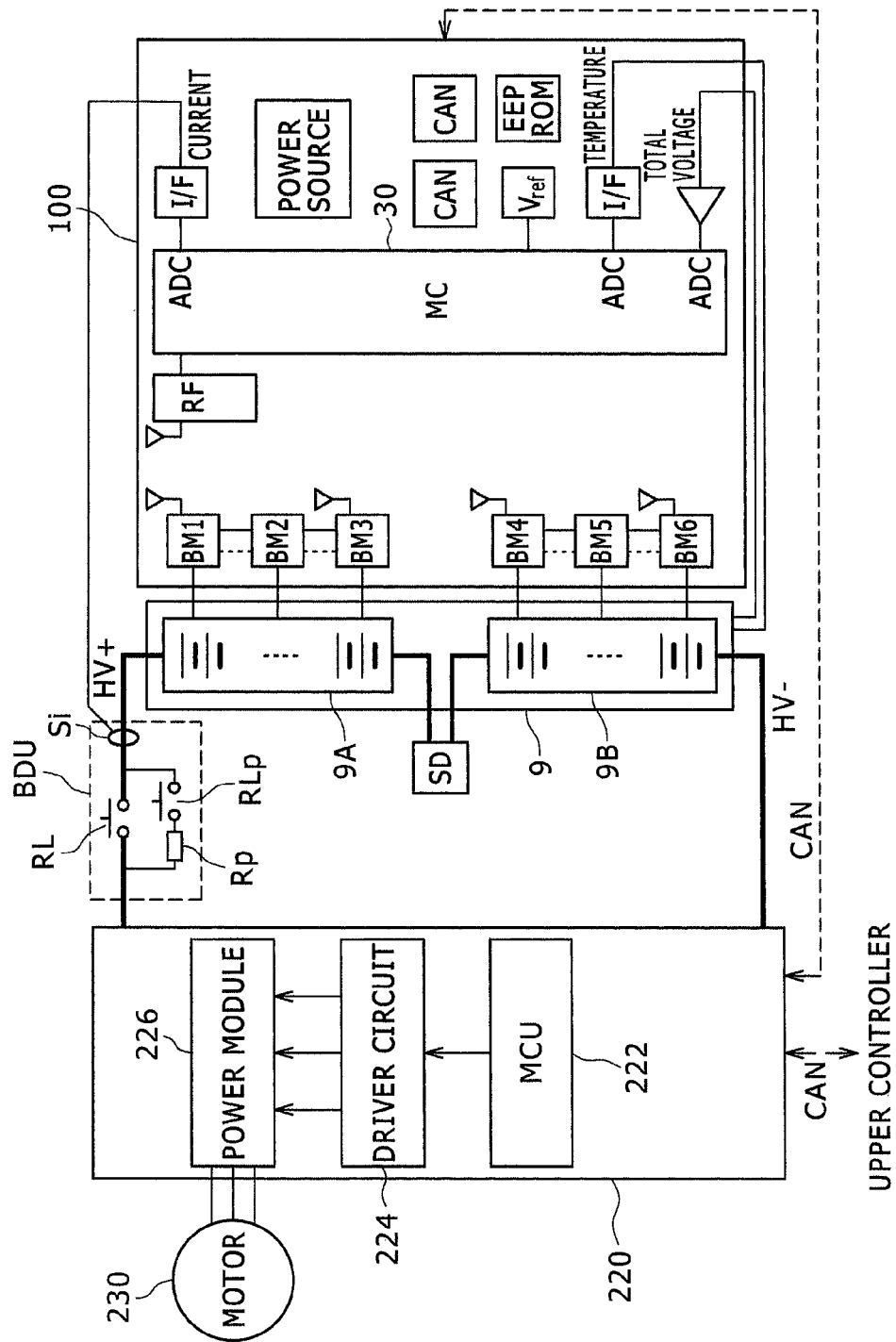
FIG. 8 is a block diagram showing the driving system of a rotary electric machine for a vehicle according to a second embodiment of the present invention.

The second embodiment of the present invention is explained as follows. FIG. 8 is a block diagram showing the driving system of a rotary electric machine for a vehicle according to the second embodiment of the present invention. In comparison, the driving system shown in FIG. 8 is different from that according to the first embodiment shown in FIG. 1 in that the battery monitoring apparatuses BM1 to BM3 as well as the battery monitoring apparatuses BM4 to BM6 are brought into a daisy chain connection with one another. In the present embodiment, the microcomputer 30 conducts radio communication not separately, but in bundle to each of those battery monitoring apparatuses BM1 to BM3 or each of those battery monitoring apparatuses BM4 to BM6 both in such daisy chain connection.

The present embodiment is explained in the same way as the first embodiment on the assumption that each cell group comprises four battery cells directly connected with one another, but the number of battery cells contained in each cell group is not limited to such specific number.

FIG. 9 is a block diagram showing the arrangements of the battery monitoring apparatuses BM1, BM2 and BM3 according to the present embodiment. The other battery monitoring apparatuses BM4 to BM6 have the similar arrangements to those of those apparatuses BM1, BM2 and BM3, which explanations are omitted for redundancy.

According to the present embodiment, the reception section 31, the power source circuit for reception 32 and the decode circuit 33 are provided only in the battery monitoring apparatus BM1 connected to the uppermost battery cell group comprising the battery cells BC1 to BC4 among the battery monitoring apparatuses BM1 to BM3 brought into such daisy chain connection with one another and are not provided in the battery monitoring apparatuses BM2 and BM3 connected to the corresponding lower battery cell groups. Further, the transmission section 36 is provided only in the battery monitoring apparatus BM3 connected to the lowermost battery cell group comprising the battery cells BC9 to BM12 and is not provided in the battery monitoring apparatuses BM1 and BM2 connected to the corresponding upper battery cell groups. On the other hand, the power source circuit for monitoring 34 and the battery monitoring circuit 35 are provided in each of the battery monitoring apparatuses BM1 to BM3. Namely, a power source circuit for monitoring 34 and a battery monitoring circuit 35 are separately provided for each of the battery cell group comprising the battery cells BC1 to BC4, the battery cell group comprising those BC5 to BC8 and the battery cell group comprising those BC9 to BC12.

When a radio signal transmitted from the microcomputer 30 is received by the reception section 31 and power is supplied from the power source circuit for reception 32 to the decode circuit 33, the decode circuit 33 performs authentication processing. At this time, the decode circuit 33 checks to which battery monitoring apparatus among those battery monitoring apparatuses BM1 to BM3 brought into a daisy chain connection with one another the received radio signal has been transmitted for authentication. When the authentication result is determined OK, the decode circuit 33 outputs an activation signal and a command to the power source circuit for monitoring 34 and the battery monitoring circuit 35 within the battery monitoring apparatus BM1 connected to the battery cells BC1 to BC4 comprising the uppermost battery cell group. Thereby, the power source circuit for monitoring 34 within the battery monitoring apparatus BM1 is activated so as to start power supply to the battery monitoring circuit 35 as well as the battery monitoring circuit 35 performs the monitoring operation according to such command for the battery cells BC1 to BC4. When such command is intended for the battery cells BC5 to BC12 corresponding to the other battery monitoring apparatuses BM2 or BM3, the battery monitoring circuit 35 does not perform such monitoring operation.

The power source circuit for monitoring 34 and the battery monitoring circuit 35 within the battery monitoring apparatus BM1 output an activation signal and a command output from the decode circuit 33 to the battery monitoring apparatus BM2 connected to the battery cells BC5 to BC8 comprising the lower battery cell group directly below the uppermost battery cell group. Further, when the battery monitoring circuit 35 within the battery monitoring apparatus BM1 has performed the monitoring operation for the battery cells BC1 to BC4, they output the monitoring results of the states of the cells as well to the battery monitoring apparatus BM2.

The power source circuit for monitoring 34 within the battery monitoring apparatus BM2 is activated according to an activation signal output from the power source circuit for monitoring 34 within the battery monitoring apparatus BM1 so as to start power supply to the battery monitoring circuit 35. Further, the battery monitoring circuit 35 performs the monitoring operation according to the command output from the battery monitoring circuit 35 within the battery monitoring apparatus BM1 for the battery cells BC5 to BC8. When such command is intended for the battery cells BC1 to BC4 or those BC9 to BC12 corresponding to the other battery monitoring apparatuses BM1 or BM3, the battery monitoring circuit 35 does not perform such monitoring operation.

The power source circuit for monitoring 34 and the battery monitoring circuit 35 within the battery monitoring apparatus BM2 output the activation signal and the command received from the battery monitoring apparatus BM1 for the battery monitoring apparatus BM3 connected to the battery cells BC9 to BC12 in the battery cell group of one low rank. Further, where the battery monitoring circuit 35 within the battery monitoring apparatus BM2 has performed the monitoring operation for the battery cells BC5 to BC8 or it has received the monitoring results of the states of the battery cells BC1 to BC4 from the battery monitoring circuit 35 within the battery monitoring apparatus BM1, they output such monitoring results as well to the battery monitoring apparatus BM3.

The power source circuit for monitoring 34 within the battery monitoring apparatus BM3 is activated according to the activation signal output from the power source circuit for monitoring 34 within the battery monitoring apparatus BM2 so as to start power supply to the battery monitoring circuit 35 and the transmission section 36. Further, the battery monitoring circuit 35 performs the monitoring operation according to the command output from the battery monitoring circuit 35 within the battery monitoring apparatus BM2 for the battery cells BC9 to BC12. When such command is intended for the battery cells BC1 to BC8 corresponding to the other battery monitoring apparatuses BM1 or BM2, the battery monitoring circuit 35 does not perform such monitoring operation.

When the battery monitoring circuit 35 within the battery monitoring apparatus BM3 has performed such monitoring operation for the battery cells BC9 to BC12, it outputs the monitoring results of the states of the cells to the transmission section 36. Further, where the battery monitoring circuit 35 has received the monitoring results of the states of the battery cells BC1 to BC4 or those BC5 to BC8 from the battery monitoring circuit 35 within the battery monitoring apparatus BM2, it outputs such monitoring results to the transmission section 36.

The transmission section 36 wirelessly transmits the monitoring results of the states of any of the battery cells BC1 to BC12 output from the battery monitoring circuit 35 within the battery monitoring apparatus BM3 to the microcomputer 30. The microcomputer 30 receives the radio signal transmitted from the transmission section 36 through the radio communication section RF so as to be able to acquire the monitoring results of the battery cells BC1 to BC12 from the battery monitoring apparatuses BM1 to BM3.

In the present embodiment, it is preferred that the power source circuit for monitoring 34 and the battery monitoring circuit 35 be arranged as circuits on the same IC. This enables those circuits disposed in the battery monitoring apparatuses BM1 to BM3 in common to be realized with just one IC, with the result that cost reduction and structural streamlining are enhanced. Such arrangement is also applicable to the above-mentioned first embodiment.

In FIG. 9, the arrangement in which three battery monitoring apparatuses BM1 to BM3 are brought into a daisy chain connection with one another is exemplified. When four or more battery monitoring apparatuses are brought into a daisy chain connection with one another, the battery monitoring apparatuses according to the number of them as desired having the same arrangement as that of the battery monitoring apparatus BM2 corresponding to the battery cell group of middle rank may only well be disposed between the battery monitoring apparatus BM1 corresponding to the uppermost battery cell group and the battery monitoring apparatus BM3 corresponding to the lowermost battery cell group. In turn, when two battery monitoring apparatuses are brought into a daisy chain connection with each other, the battery monitoring apparatus BM1 corresponding to the uppermost battery cell group and the battery monitoring apparatus BM3 corresponding to the lowermost battery cell group may only well be brought into such connection by deleting the battery monitoring apparatus BM2 from the arrangement shown in FIG. 9.

According to the present embodiment, the following operational effects are brought.

(4) When the power source circuit for monitoring 34 within the battery monitoring apparatus BM1 connected to the uppermost battery cell group comprising the battery cells BC1 to BC4 receives an activation signal from the decode circuit 33, it supplies power to the battery monitoring circuit 35 connected to such battery cell group as well as outputs the activation signal to the power source circuit for monitoring 34 within the battery monitoring apparatus BM2 connected to the battery cell group of one low rank comprising the battery cells BC5 to BC8. When the power source circuit for monitoring 34 within the battery monitoring apparatus BM2 connected to the battery cell group of middle rank comprising the battery cells BC5 to BC8 receives the activation signal from the power source circuit for monitoring 34 within the battery monitoring apparatus BM1 connected to the battery cell group of one upper rank, it supplies power to the battery monitoring circuit 35 connected to the battery cell group of middle rank as well as outputs the activation signal to the power source circuit for monitoring 34 within the battery monitoring apparatus BM3 connected to the battery cell group of one low rank comprising the battery cells BC9 to BC12. When the power source circuit for monitoring 34 within the battery monitoring apparatus BM3 connected to the lowermost battery cell group comprising the battery cells groups BC9 to BC12 receives the activation signal from the power source circuit for monitoring 34 within the battery monitoring apparatus BM2 connected to the battery cell group of one upper rank, it supplies power to the battery monitoring circuit 35 and the transmission section 36 connected to the lowermost battery cell group. The battery monitoring system 100 is arranged such that the respective battery monitoring apparatuses are brought into a daisy chain connection with one another and power supply subsequently starts at each of them, so that the number of components required for constructing the battery monitoring system 100 is reducible so that cost reduction can be enhanced accordingly.

(5) When the battery monitoring circuit 35 within the battery monitoring apparatus BM1 connected to the uppermost battery cell group comprising the battery cells BC1 to BC4 receives a command from the decode circuit 33, it outputs such command and the monitoring results of state of the battery cell group to the battery monitoring circuit 35 within the battery monitoring apparatus BM2 connected to the battery cell group of one low rank comprising the battery cells BC5 to BC8. When the battery monitoring circuit 35 within the battery monitoring apparatus BM2 connected to the battery cell group of middle rank comprising the battery cells BC5 to BC8 receives the command from the battery monitoring circuit 35 within the battery monitoring apparatus BM1 connected to the battery cell group of one upper rank, it outputs such command and the monitoring results of states of the each battery cell group of upper rank as well as such results of state of the battery cell group of middle rank to the battery monitoring circuit 35 within the battery monitoring apparatus BM3 connected to the battery cell group of one low rank comprising the battery cells groups BC9 to BC12. When the battery monitoring circuit 35 within the battery monitoring apparatus BM3 connected to the lowermost battery cell group comprising the battery cells groups BC9 to BC12 receives the command from the battery monitoring circuit 35 within the battery monitoring apparatus BM2 connected to the battery cell group of one upper rank, it outputs the monitoring results of states of the each battery cell group of upper rank and the monitoring result of state of the lowermost battery cell group to the transmission section 36. This enables the monitoring results of the states of the cells to be subsequently output from the respective battery monitoring apparatuses brought into a daisy chain connection with one another and such results in bundle to be returned in response to the microcomputer 30.

The above-described embodiments or various modified examples may be solely applied or combined in an arbitrary manner.

The above-described embodiments and various modified examples are exemplified just for example, so that the present invention is not limited to them as far as the characteristic features of the present invention are not ruined.

The invention claimed is:

1. A battery monitoring apparatus to monitor a state of a battery comprising one of one battery cell and a plurality of battery cells connected in series, the battery monitoring apparatus comprising:
   a reception section to receive a radio signal transmitted from an upper controller and to output power according to the radio signal and a demodulated signal based on the radio signal;
   a first power source circuit to perform power supply based on the power output from the reception section;
   a decode circuit to operate upon receiving the power supply from the first power source circuit and to perform authentication based on the demodulated signal output from the reception section as well as to output an activation signal according to a result of the authentication and a command based on the demodulated signal;
   output from the decode circuit and to perform power supply based on power of the battery; a battery monitoring circuit to operate upon receiving the power supply from the second power source circuit and to output a monitoring result of a state of the battery according to the command output from the decode circuit; and
   a transmission section to operate upon receiving the power supply from the second power source circuit and to wirelessly transmit the monitoring result output from the battery monitoring circuit to the upper controller;
   wherein the battery monitoring apparatus includes a plurality of the second power source circuits and a plurality of the battery monitoring circuits,
   wherein the battery is arranged such that a plurality of battery cell groups each comprising one of one battery cell and a plurality of battery cells connected in series are connected in series,
   wherein the second power source circuit and the battery monitoring circuit are separately provided for each of the battery cell groups,
   wherein when the second power source circuit connected to an uppermost battery cell group among the battery cell groups receives the activation signal from the decode circuit, the second power source circuit performs power supply to the battery monitoring circuit connected to the uppermost battery cell group as well as outputs the activation signal to the second power source circuit connected to a lower battery cell group directly below the uppermost battery cell group,
   wherein when the second power source circuit connected to an intermediate battery cell group among the battery cell groups receives the activation signal from the second power source circuit connected to the battery cell group one rank above the intermediate battery cell group, the second power source circuit connected to the intermediate battery cell group performs power supply to the battery monitoring circuit connected to the intermediate battery cell group as well as outputs the activation signal to the second power source circuit connected to the battery cell group one rank below the intermediate battery cell group, and
   wherein when the second power source circuit connected to a lowermost battery cell group among the battery cell groups receives the activation signal from the second power source circuit connected to the battery cell group one rank above the lowermost battery cell group, the second power source circuit performs power supply to the battery monitoring circuit connected to the lowermost battery cell group and the transmission section.

2. The battery monitoring apparatus according to claim 1, wherein when the activation signal is not output again from the decode circuit to the second power source circuit by a time when a prescribed time-out duration has passed since the second power source circuit is activated, the second power source circuit halts power supply to the battery monitoring circuit and the transmission section.

3. The battery monitoring apparatus according to claim 2, wherein the upper controller transmits the radio signal with a period shorter than the time-out duration.

4. The battery monitoring apparatus according to claim 1,
wherein when the battery monitoring circuit connected to the uppermost battery cell group receives the command from the decode circuit, the battery monitoring circuit connected to the uppermost battery cell group outputs the command and monitoring results of states of the battery cells comprising the uppermost battery cell group to the battery monitoring circuit connected to the battery cell group one rank below the uppermost battery cell group, wherein when the battery monitoring circuit connected to the intermediate battery cell group receives the command from the battery monitoring circuit connected to the battery cell group one rank above the intermediate battery cell group, the battery monitoring circuit connected to the intermediate battery cell group outputs the command and the monitoring results of the states of the battery cells comprising the battery cell group one rank above the intermediate battery group as well as the monitoring results of the states of the battery cells comprising the intermediate battery cell group to the battery monitoring circuit connected to the battery cell group one rank below the intermediate battery cell group, and wherein when the battery monitoring circuit connected to the lowermost battery cell group receives the command from the battery cell group one rank above the lowermost battery cell group, the battery monitoring circuit connected to the lowermost battery cell group outputs the monitoring results of the states of the battery cells comprising the battery cell group one rank above the lowermost battery cell group and the monitoring results of the states of the battery cells comprising the lowermost battery cell group to the transmission section.

5. A battery monitoring system comprising:
the battery monitoring apparatus according to claim 1; and
the upper controller.

6. The battery monitoring apparatus according to claim 1, wherein the first power source circuit performs the power supply only while the reception section is receiving the radio signal.

7. The battery monitoring apparatus according to claim 1, wherein the decode circuit performs the authentication and outputs the activation signal as well as the command in such a manner that the decode circuit operates only while the reception section is receiving the radio signal.

8. The battery monitoring apparatus according to claim 1, wherein the second power source circuit is not activated when the power supply is not performed from the first power source circuit.

* * * * *